United States Patent [19]

Ueno et al.

[11] Patent Number: 5,731,247
[45] Date of Patent: Mar. 24, 1998

[54] METHOD FOR MANUFACTURING A SEMICONDUCTOR DEVICE INCLUDING PRE-OXIDATION PROCESS

[75] Inventors: Yoshihiro Ueno, Yokohama; Tsutomu Amai, Kawasaki; Shuichi Samata, Yokohama, all of Japan

[73] Assignee: Kabushiki Kaisha Toshiba, Kawasaki, Japan

[21] Appl. No.: 498,755

[22] Filed: Jul. 6, 1995

[30] Foreign Application Priority Data

Jul. 7, 1994 [JP] Japan .................... 6-156210

[51] Int. Cl.$^6$ .................................. H01L 21/316
[52] U.S. Cl. ............................ 438/773; 438/974
[58] Field of Search .................. 437/235, 239, 437/238, 247, 42, 941, 946; 134/2

[56] References Cited

U.S. PATENT DOCUMENTS

| | | | |
|---|---|---|---|
| 4,409,260 | 10/1983 | Rastor et al. | 437/239 |
| 4,920,076 | 4/1990 | Holland et al. | 437/239 |
| 5,132,244 | 7/1992 | Roy | 437/946 |
| 5,308,788 | 5/1994 | Fitch et al. | 437/946 |
| 5,312,766 | 5/1994 | Aronowitz et al. | |
| 5,316,981 | 5/1994 | Gardner et al. | 437/235 |
| 5,489,550 | 2/1996 | Moslehi | 437/950 |

FOREIGN PATENT DOCUMENTS

| | | | |
|---|---|---|---|
| 0 488 148 | 6/1992 | European Pat. Off. | |
| 0574809 | 12/1993 | European Pat. Off. | 437/239 |

OTHER PUBLICATIONS

Journal of Vacuum Science and Technology, Part A, vol. 9, No. 3, May/Jun. 1991, pp. 1058–1065, M. Offenberg, et al., "Surface Etching and Roughening in Integrated Processing of Thermal Oxides".

Patent Abstracts of Japan, vol. 17, No. 514(E–1433), Sep. 16, 1993, JP 05 136 111, Jun. 1, 1993.

J. Electrochem. Soc., vol. 132, No. 2, pp. 409–415, Feb. 1985, K. Nassau, et al., "Modified Phosphosilicate Glasses for VLSI Applications".

Extended Abstracts of Electrochemical Society Fall Meeting, Abstract No. 228, pp. 359–360, 1983, Asif Iqbal, et al., "Phosphogermandsilicate Glass Films For VLSI Devices".

*Primary Examiner*—John Niebling
*Assistant Examiner*—S. Mulpuri
*Attorney, Agent, or Firm*—Oblon, Spivak, McClelland, Maier & Neustadt, P.C.

[57] ABSTRACT

A method for manufacturing a semiconductor device can reduce a micro-roughness and does not change a construction and electric characteristics of elements formed in the semiconductor device. In the method for manufacturing the semiconductor device including a pre-oxidation process in which an oxide layer is first formed on a silicon wafer, and the oxide layer is secondly eliminated to eliminate impurities on a surface of the silicon wafer, a formation of the oxide layer in the pre-oxidation process is performed in an oxidization atmosphere including $H_2O$ and gas including germanium hydride (german —$GeH_4$—). Since german ($GeH_4$) is included in the oxidization atmosphere, it is possible to reduce a softening temperature of the silicon dioxide formed in pre-oxidation, thereby decreasing the micro-roughness on the surface of the silicon wafer. Furthermore, since it is possible to perform the pre-oxidation process in a low temperature and in a short time, there is no change of a construction and electric characteristics of elements formed in the semiconductor device.

11 Claims, 5 Drawing Sheets

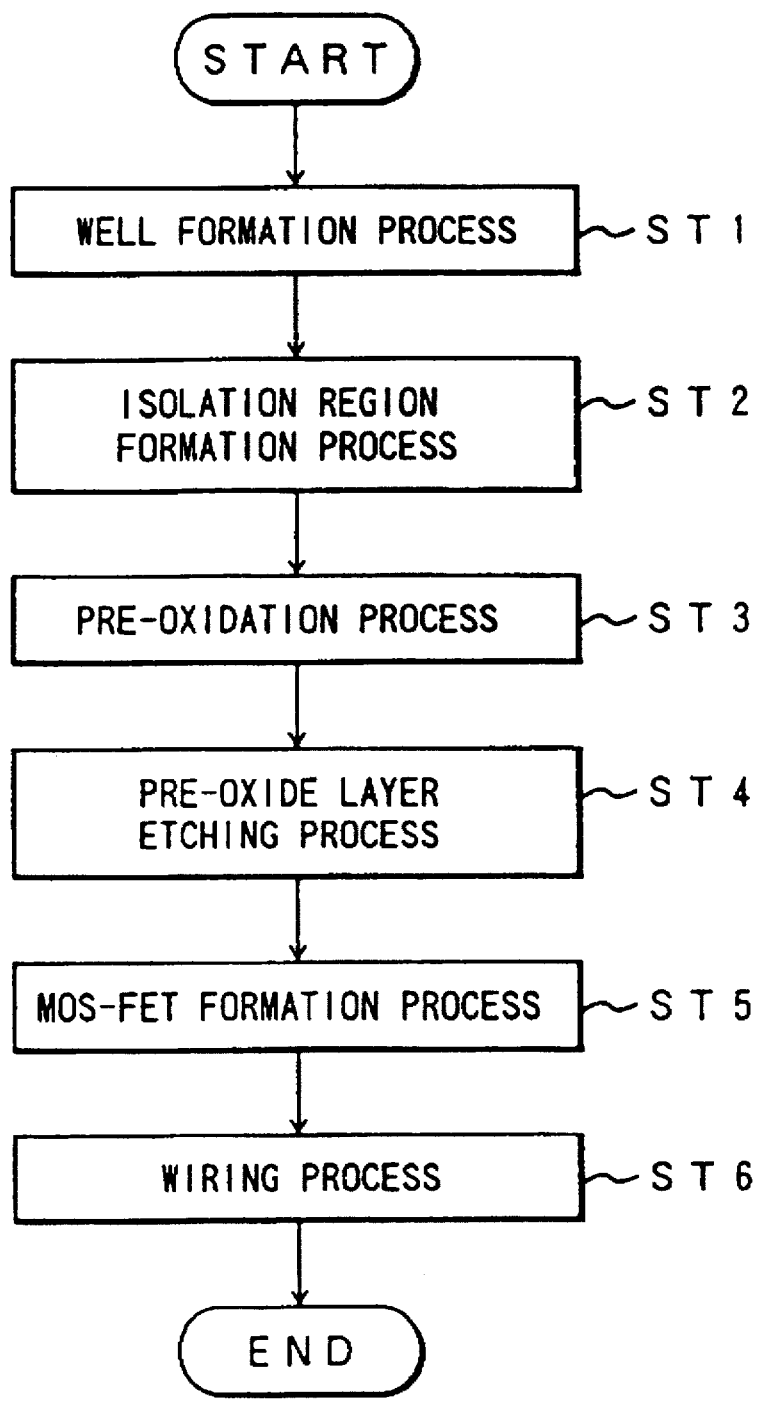
F I G. 1

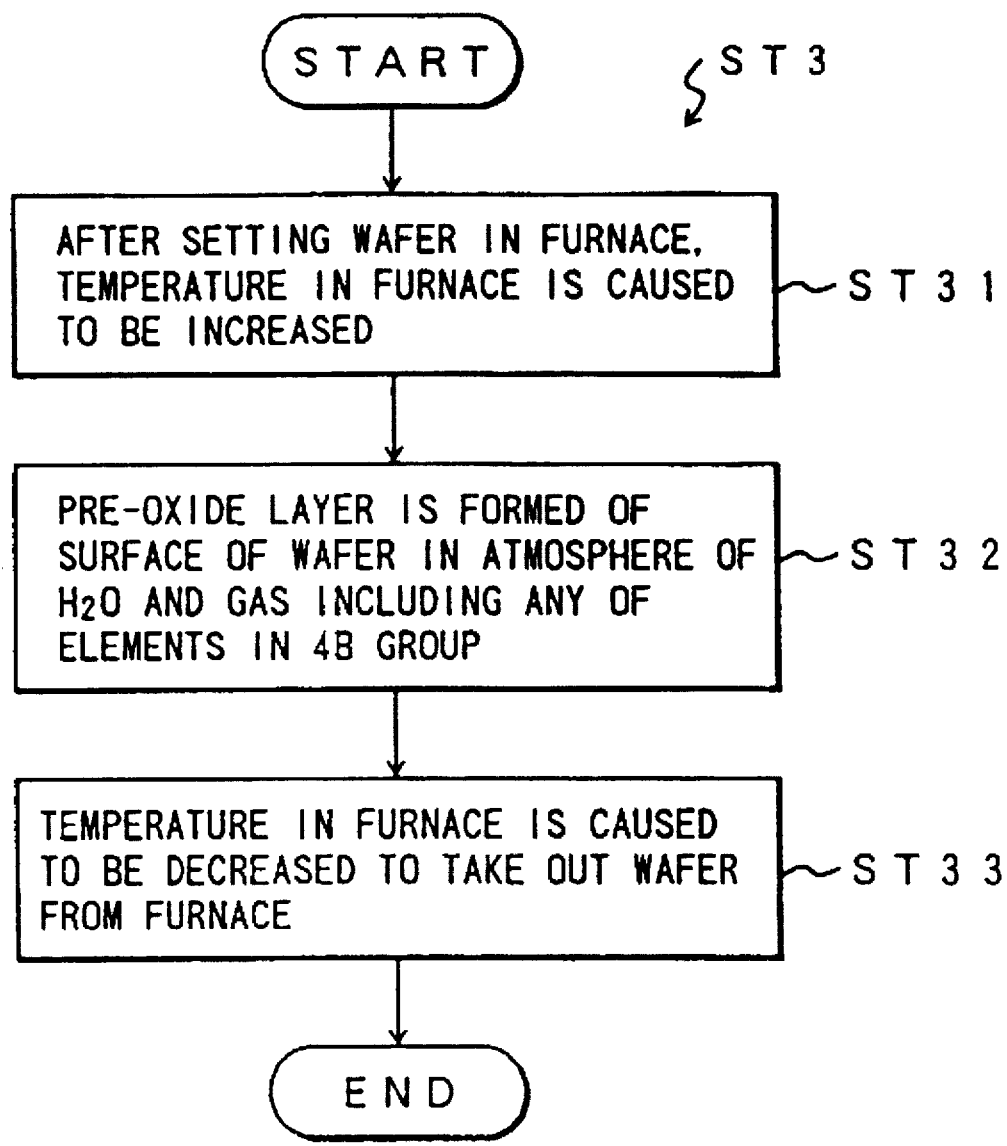
F I G. 2

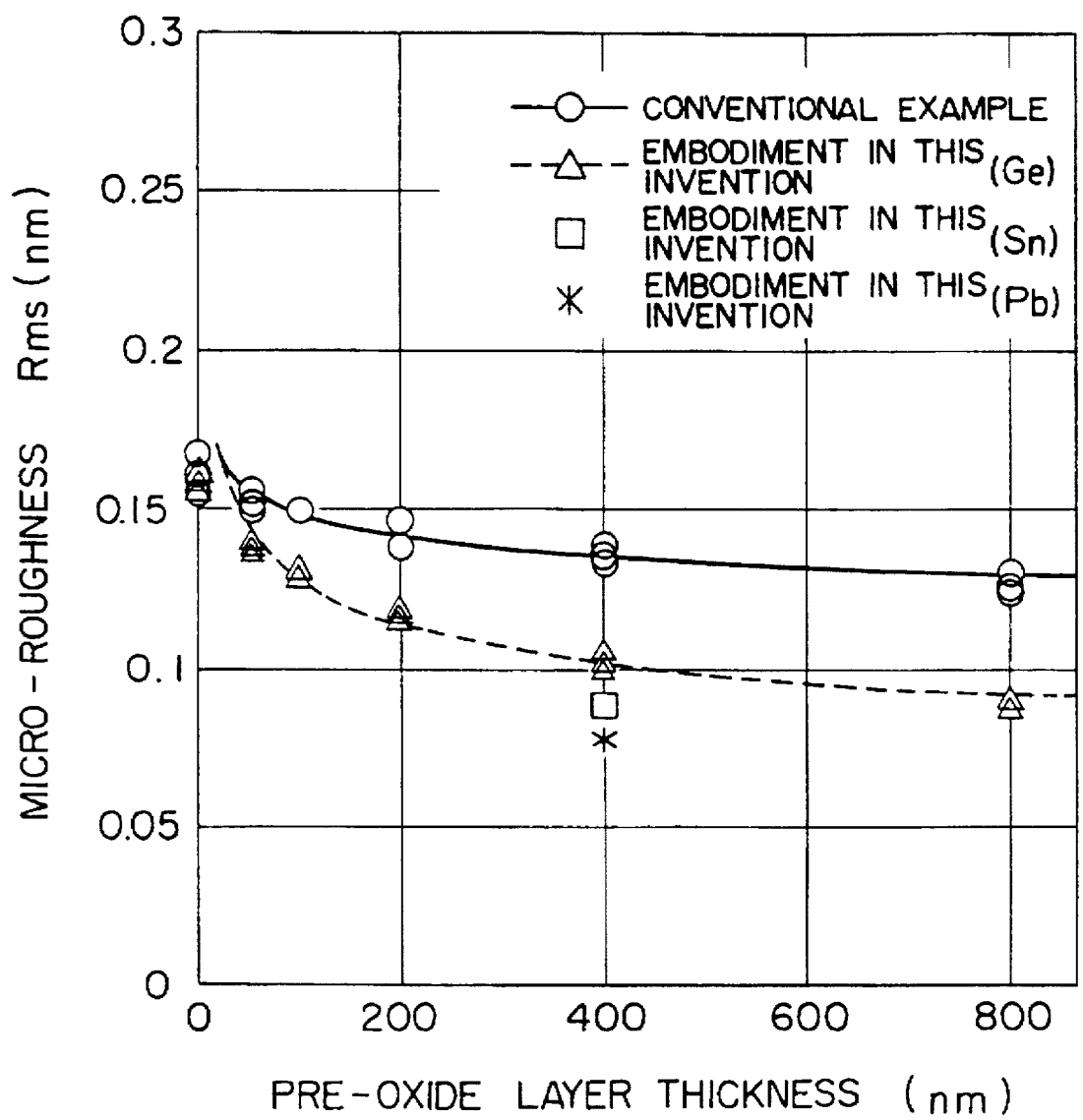
F I G. 3

METHOD FOR MANUFACTURING A SEMICONDUCTOR DEVICE INCLUDING PRE-OXIDATION PROCESS

BACKGROUND OF THE INVENTION

The present invention relates to a method of manufacturing a semiconductor device, and more specifically, to a method including pre-oxidation process for manufacturing a semiconductor device.

Hitherto, pre-oxidation process is well known as process which is used in a manufacturing process for a semiconductor device. In the pre-oxidation process, an oxidation layer is first formed on a semiconductor substrate, and is second eliminated from the substrate. The pre-oxidation process is performed before a gate oxide layer and the like are formed for the purpose of eliminating impurity onto a surface of the semiconductor substrate.

A method of performing pre-oxidation is divided into dry $O_2$ oxidation and wet oxidation.

Dry $O_2$ oxidation is a method of forming an oxide layer by using oxygen. Even though dry $O_2$ oxidation has a slow oxidation rate, it is possible to control a high accurate layer thickness. There is a chemical reaction formula of dry $O_2$ oxidation as follows:

$$Si+O_2=SiO_2.$$

On the other hand, wet oxidation is a method of forming an oxide layer by using a water vapor (steam —$H_2O$). Even though wet oxidation has a low accuracy of thickness of an oxidation layer, it is possible to cause the oxidation rate to be high. There is a chemical reaction formula of wet oxidation as follows:

$$Si+2H_2O=SiO_2+2H_2$$

Since it is unnecessary to control a high accuracy of a layer thickness, wet oxidation is usually applied to pre-oxidation with a high oxidation rate.

Recently, it is impossible to ignore a micro-roughness with miniaturization and high integration of the semiconductor device. Here, a term of micro-roughness means an atomic scale unevenness which is formed onto a surface of a crystal of the semiconductor device, and becomes a cause which makes an electric failure of the semiconductor device such as reliability of gate oxide.

When elements formed in the semiconductor device have a large size because a degree of integration is small, since it is possible to cause a layer thickness to be thick with respect to an oxide layer such as a gate oxide layer and the like which is formed on a semiconductor substrate, there is few influence of a micro-roughness. However, it is necessary to cause the oxide layer to be thin with advancing a miniaturization and high-integration of the semiconductor device, thereby increasing influence of micro-roughness giving an electric characteristic to thereby result this influence which can not be ignored.

In order to eliminate above problems, we inventors attempted to provide two methods, in which one is a method of lengthening an oxidation time period of the semiconductor substrate in the pre-oxidation process, namely, causing the oxide layer to be thick, the other is a method of causing an oxidation temperature. As a result, it is possible to eliminate impurities and to decrease the micro-roughness on the surface of the semiconductor device.

However, when the oxidation time period lengthens and the oxidation temperature is higher with respect to the semiconductor substrate in the pre-oxidation process, there occurs new problem in which impurities in an impurity region formed in the semiconductor substrate diffuses again. In other words, when there is a pre-oxidation process after implementing an ion into the semiconductor substrate for diffusion in order to form an impurity diffusion region such as source and drain regions, lengthening of the oxidation time period and the high-temperature of the oxidation temperature cause the impurity diffusion region to spread to change an element construction, thereby disabling the semiconductor device to obtain the designed electric characteristics.

Therefore, it is actually impossible to adapt the methods of lengthening the oxidation time period and causing the oxidation temperature to be high to the semiconductor device in order to decrease the micro-roughness during the pre-oxidation process.

SUMMARY OF THE INVENTION

In view of the above-mentioned problems included in the prior art, an object of the present invention is to provide a method of manufacturing a semiconductor device in which a micro-roughness can be reduced and a construction and electric characteristic of an element formed in the semiconductor device do not change.

In order to achieve the above object, a method of manufacturing a semiconductor device according to the present invention comprises at least a pre-oxidation process for eliminating impurities from a surface of a semiconductor substrate by eliminating an oxidation layer after forming the oxidation layer, further comprises a step of forming the oxidation layer during the pre-oxidation process in an oxidation atmosphere including a steam and gas including any of chemical elements in a 4B group.

According to the present invention, in the pre-oxidation process, since the oxidation atmosphere including the steam has gas including the chemical elements in the 4B group in a periodical table, even though the oxidation process is performed in the low-temperature and short time period, it is possible to reduce the micro-roughness. The reason why micro-roughness decreases is that, since a pre-oxidation layer includes at least one of chemical elements in the 4B group in a periodical table, a softening temperature of the pre-oxidation layer can be reduced.

As described above, since the oxidation atmosphere in a pre-oxidation process includes gas having any of chemical elements in a 4B group in a periodical table, the present invention can decrease the softening temperature of a pre-oxidation layer, thereby reducing a micro-roughness on the surface of the semiconductor substrate. Furthermore, since the pre-oxidation process can be performed in a short time at a low temperature, there is no change of the construction and electric characteristics of the elements formed in the semiconductor device.

BRIEF DESCRIPTION OF THE DRAWINGS

In the accompanying drawings:

FIG. 1 is a flowchart showing entire processes of a method for manufacturing a semiconductor device according to the present invention;

FIG. 2 is a flowchart showing a pre-oxidation process according to the present invention:

FIG. 3 is a characteristic diagram showing graphs of a measurement result with respect to a relationship between a thickness of an oxidation layer and a micro-roughness in a pre-oxidation process;

DETAILED DESCRIPTION OF THE PREFERRED EMBODIMENTS

Figure 4:
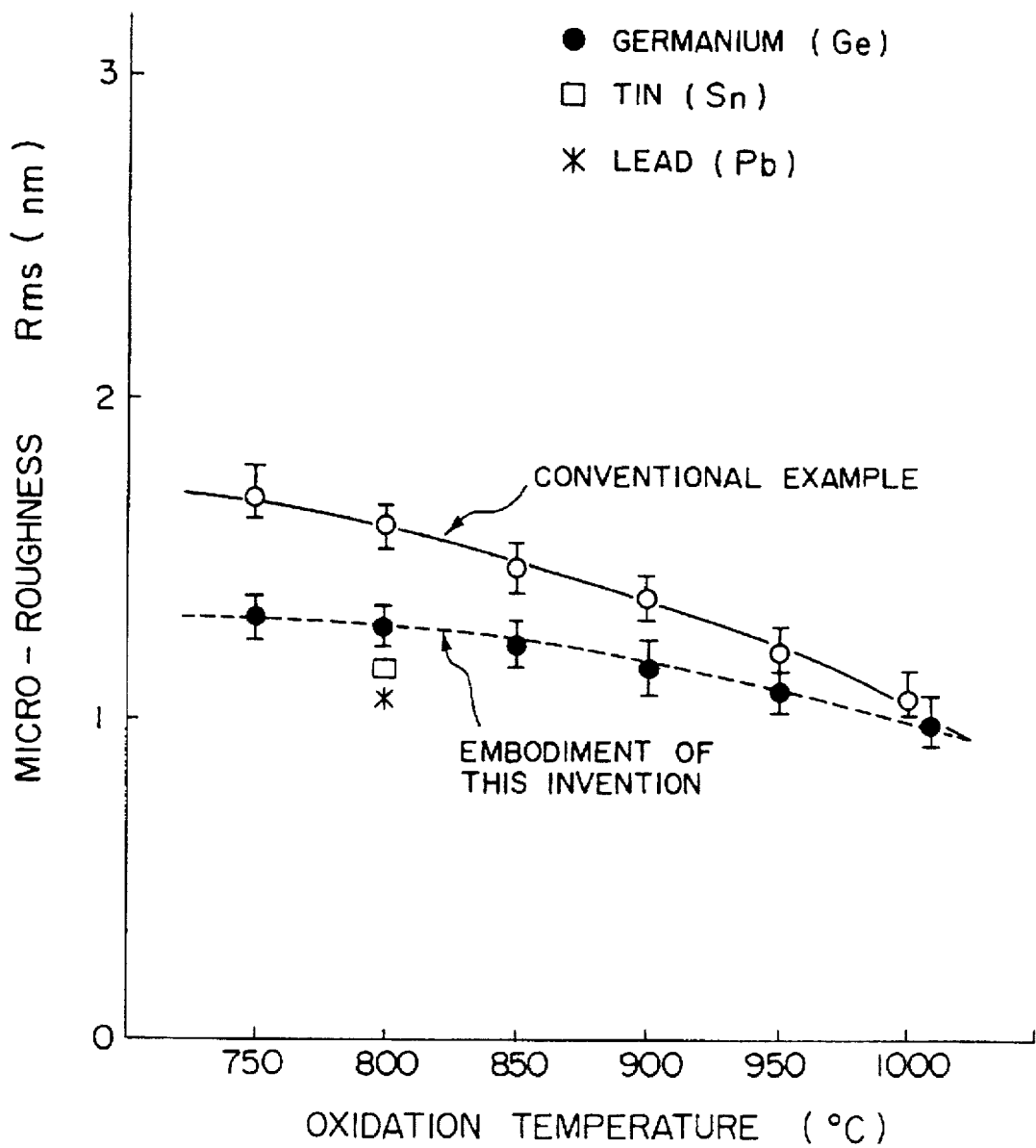
FIG. 4 is a characteristic diagram showing graphs of a measurement result with respect to a relationship between an oxidation temperature and a microroughness in a pre-oxidation process.

There will be described in detail a method for manufacturing a semiconductor device according to preferred embodiments of the present invention in comparison with the conventional method for manufacturing the semiconductor device.

Before describing preferred embodiments of the present invention, there are schematically described outline steps in a manufacturing method with which the present invention is applied, and a fundamental concept of which the present invention is applied with a pre-oxidation step in the outline steps, with reference to FIGS. 1 and 2.

FIG. 1 is a flow chart showing a process for manufacturing a semiconductor device with which the present invention is applied. The manufacturing process of the semiconductor device comprises, as shown in FIG. 1, a well formation process (step ST1) for forming a diffusion layer to be a well on a surface of a wafer as a semiconductor substrate; an isolation region formation process (step ST2) for forming an isolation region by an oxide layer on the well previously formed; a pre-oxidation process (step ST3) for forming as a pre-oxide layer an oxide layer having a purpose of eliminating impurities on the surface of the wafer; a pre-oxide layer etching process (step ST4) for eliminating the pre-oxide layer formed in the pre-oxidation process; a MOSFET formation process (step ST5) for forming a MOS-FET (metal-oxide semiconductor field-effective-transistor) by performing gate formation, gate oxidation and etching with respect to a desired pattern formed by a photo-resist layer on the surface of the wafer from which the pre-oxide layer is eliminated; and a wiring process (step ST6) for forming wiring to the formed MOS-FET to complete the semiconductor device. Since entire flow of the process is substantially the same as that of the general manufacturing method with respect to a manufacture of the semiconductor device, it is possible to apply various changes and modification in the manufacturing method which has provided until the present time.

Next, there is described in more detaile a flow in the pre-oxidation process with reference to FIG. 2, because the pre-oxidation process as the step ST3 shown in FIG. 1 is a feature of the present invention, namely, an oxidation process for a wafer in the pre-oxidation process.

FIG. 2 is a flow chart showing the detailed flow in the pre-oxidation process (step ST3) of the manufacturing method for the semiconductor device according to the present invention. In the figure, step ST31 is a process in which, after an isolation region is formed on the semiconductor device to set in the furnace, a temperature in the furnace is caused to be increased until an optimum temperature in which an oxidation is effective to be done.

Next, in step ST32, an atmosphere is supplied into the furnace in the maner of including $H_2O$, and gas including any of chemical elements in the 4B group in order to form a pre-oxidation layer on a surface of the wafer by a repletion of atmosphere in the furnace. Here, gas including any of chemical elements in the 4B group is, for example, germanium hydride (german —$GeH_4$—) gas and gas including other elements such as germanium (Ge), tin (Sn) and lead (Pb).

At last, step ST33 is a process in which, after a temperature in the furnace is decreased with the set wafer, the wafer is taken out from the furnace to complete the pre-oxidation process ST3.

A FIRST EMBODIMENT

There is shown as a first embodiment a measurement result with respect to a relationship between a micro-roughness and an oxidation layer thickness (namely, an oxidation time period) in the pre-oxidation process.

There is selected as the semiconductor substrate an N-type silicon wafer having six inches diameter, a (100) crystal plane and 1–60 $\Omega \cdot cm$ of a resistivity. There is performed the pre-oxidation process according to the first embodiment in accordance with the following procedure.

i) At first, the silicon wafer is provided into a furnace into which $H_2O$ and german ($GeH_4$) gas are supplied. Here, german gas corresponds to gas including chemical elements in a 4B group in claims. $H_2O$ is produced by $O_2$ gas and $H_2$ gas of the flow rate of 10 liters/minute, respectively, and $H_2$ gas including, 4% $GeH_4$ gas is also applied to the furnace with the flow rate of 1 liter/minute. Heat of the silicon wafer with 800° C. forms an oxide layer onto the silicon wafer.

In the first embodiment, an oxidation time period changes to several silicon wafers each including oxide layers having layer thickness of 0 nm, 50 nm, 100 nm, 200 nm, 400 nm and 800 nm.

ii) Then, the oxidation layer of each silicon wafer is taken off by ammonium fluoride ($NH_4F$ or $NH_4HF_2$), respectively.

iii) At last, an atomic force microscope (AFM) as a measuring apparatus measures a micro-roughness on a surface of each silicon wafer.

Furthermore, we manufactured a sample for a comparison, in which a silicon wafer as the same as the present invention is treated by the pre-oxidation according to the conventional manufacturing method. This manufacturing method has the same steps i) through iii) as the present invention except that $H_2$ gas including german ($GeH_4$) gas is not used at forming an oxidation layer during the above step i).

FIG. 3 shows a measurement result of the micro-roughness with respect to each sample. As understood by the figure, micro-roughness is reduced with the oxidation layer of the pre-oxidation thicker, and the sample of the present embodiment has micro-roughness smaller than that of the conventional example.

Accordingly, the micro-roughness can be reduced by lengthening an oxidation time period in the pre-oxidation process, namely, causing the layer thickness of the oxide layer in the pre-oxidation process to be thicker, thereby resulting that the impurity diffusion region is diffused again by the long time period of the oxidation time as described above. Accordingly, it is limited to lengthen the oxidation time. Furthermore, lengthening of the oxidation time (namely, an allowability of re-diffusion in the impurity diffusion layer) is determined in correspondence with such as a degree of an integration of the manufactured semiconductor device. In this embodiment, when the limit value of the oxidation time is provided, the micro-roughness of the limit value can be reduced rather than the case of the conventional manufacturing method.

When the layer thickness of the oxide layer is thin, there is a small value of the difference between occurring amounts of the micro-roughness of samples of the present embodiment and the conventional example. After we inventors investigated the thickness, it is desired that the layer thickness of the oxide layer should be on or over 30 nm.

SECOND EMBODIMENT

Next, the second embodiment is shown as the result measured between the relationship an oxidation temperature and micro-roughness in the pre-oxidation process.

A semiconductor substrate is applied as an N-type silicon wafer of 6 inches of (100) crystal surface having a resistance of 1–60 Ω·cm. the pre-oxidation process of this embodiment is performed in accordance with the following procedure:

i) The silicon wafer is provided in the furnace into which atmosphere including $H_2O$ and german (GeH$_4$) gas is supplied. Here, in the same manner of the first embodiment, $H_2O$ is produced by oxygen ($O_2$) gas and hydrogen ($H_2$) gas of the flow rate of 10 liters/minute, respectively, and $H_2$ gas including GeH$_4$ gas is also applied to the furnace with the flow rate of 1 liter/minute.

In this embodiment, particular samples are formed in the case of oxidation temperature at 750° C., 800° C., 850° C., 900° C. and 1000° C., respectively. The thickness of the oxide layer is set to about 30 nm in the case of 750° C. and 800° C., and to about 100 nm in the case of 850° C., 900° C. and 1000° C. The reason why the layer thickness corresponding to the temperature are different, is to equalize the oxidation time in particular temperature.

ii) Then, the oxide layer of each silicon wafer is taken off by ammonium fluoride.

iii) At last, the AFM as a measuring apparatus measures a micro-roughness on a surface of each silicon wafer.

Furthermore, samples are manufactured by the pre-oxidation process according to the conventional manufacturing method by using the silicon wafer as the same as the present embodiment. The manufacturing method is the same as this embodiment including steps i) through iii) except that $H_2$ gas including 4% german (GeH$_4$) gas is not used during forming an oxide layer in step i).

FIG. 4 shows a measurement result of the micro-roughness of each of these samples. As understood from the figure, micro-roughness is reduced with the oxidation temperature of the pre-oxidation higher, and the sample of the present embodiment has micro-roughness smaller than that of the conventional example in any of the oxidation temperature. Accordingly, even though the micro-roughness can be reduced by causing the pre-oxidation process to be higher, since the impurity diffusion region is diffused again by higher temperature as described above, higher temperature is limited. Furthermore, capability of the oxidation temperature (namely, an allowability of re-diffusion in the impurity diffusion layer) is determined in correspondence with such as a degree of an integration of the manufactured semiconductor device. In this embodiment, when the limit value of the oxidation temperature is provided, the micro-roughness of the limit value can be reduced rather than the case of the conventional manufacturing method.

In order to investigate the oxidation temperature in the manufacturing method according to this embodiment, we measured the relationship between the oxidation temperature and re-diffusion of the impurity diffusion region.

Figure 5:
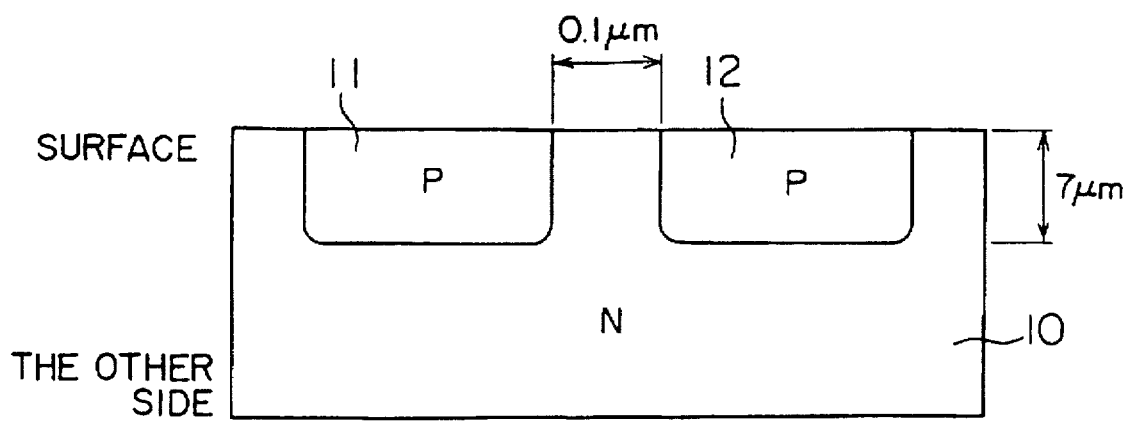
FIG. 5 is a sectional view schematically showing a sample used for measuring a relationship between an oxidation temperature and re-diffusion of an impurity diffusion region in the pre-oxidation process.
Figure 6:
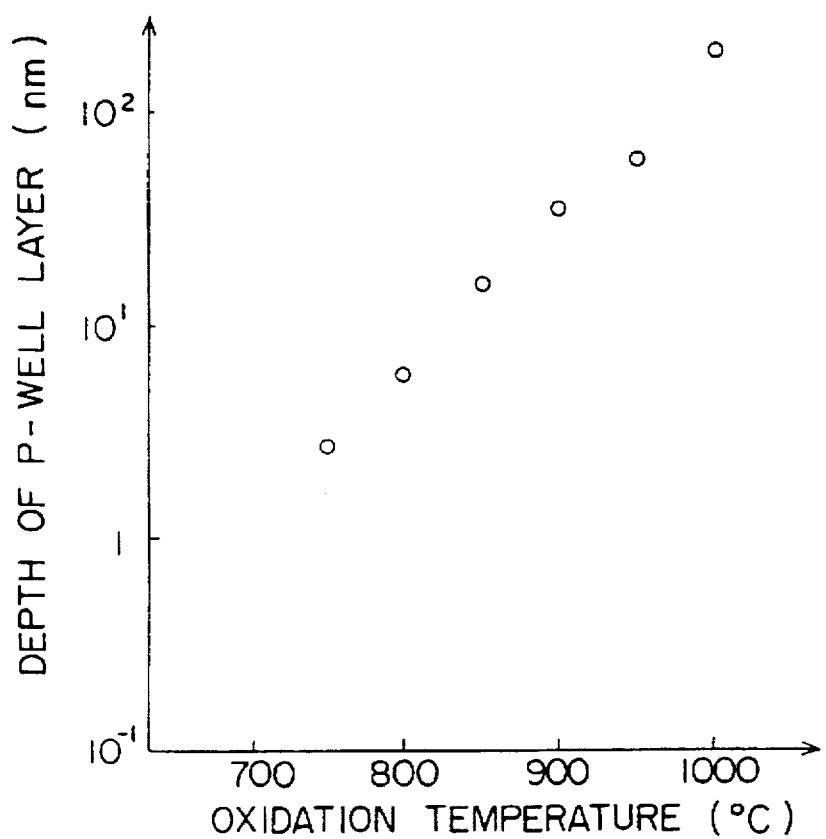
FIG. 6 is a characteristic diagram showing graphs of a measurement result with respect to a relationship between an oxidation temperature and an impurity diffusion region in the pre-oxidation process.

The semiconductor substrate is applied for an N-type silicon wafer having 6 inches, (100) crystal plane and resistance 1–60 Ω·cm. A sample is manufactured in accordance with the following procedure.

i) At first, boron (B) ion is implanted into the semiconductor substrate as shown in FIG. 5 with an acceleration voltage of 150 keV and a concentration of "$1.8 \times 10^{12}/cm^2$", and a well is diffused in 24 hours and in a nitrogen atmosphere of 1190° C. to form P-well layers (impurity diffusion regions) 11 and 12. Here, depth of the P-well layers is 7 μm and distance between both of the layers is 0.1 μm.

ii) Next, the silicon wafer is installed in the furnace to supply atmosphere including $H_2O$ and gas including german (GeH$_4$). Here, $H_2O$ is produced by oxygen and hydrogen gas of the flow rate of 10 liters/minute, respectively, as the same manner as above, and $H_2$ gas including 4% GeH$_4$ is applied to the furnace with the flow rate of 1 liter/minute. Oxide layers are respectively formed on surfaces of each of silicon wafers after heat processing in one hour with respect to cases of the oxidation temperature of 750° C., 800° C., 850° C., 900° C. and 1000° C., respectively.

iii) After that, the oxide layer on each sample is taken off by using ammonium fluoride.

iv) A depth of P-well layer is measured with respect to each sample.

FIG. 5 shows a measurement result of the depth of P-well layer. As understood from the figure, the higher the oxidation temperature of the pre-oxidation is, the larger the depth of the P-well layer is.

As described above, an allowable value of the depth of the P-well layer changes corresponding to a degree of an integration of the manufactured semiconductor device. For example, when the depth of the P-well layer is suppressed within 35 nm, it is understood that an upper limit value of the oxidation temperature is 900° C.

On the other hand, a lower limit value of the oxidation temperature in the pre-oxidation process is determined form a softening temperature of the semiconductor device. For example, when german (GeH$_4$) gas is used as 4B chemical element group gas in this embodiment, it is desired that the oxidation layer forming temperature is on or over 750° C. because the softening temperature of silicon decreases to 750° C. when germanium Ge is used for 4B chemical element group.

THIRD EMBODIMENT

Next, there is shown as the third embodiment an estimation result of reliability for the semiconductor device which has been manufactured by the manufacturing method according to the present invention.

A (100) crystal plane N-type silicon wafer is applied for the semiconductor substrate, which has 6 inches and a resistance of 1–60 Ω·cm in the same manner of the first and second embodiments. The pre-oxidation is performed in accordance with the following procedure.

i) At first, as the same manner of the first and second embodiments, the silicon wafer is provided in the furnace to supply atmosphere including $H_2O$ and gas including german (GeH$_4$). Here, as the same manner of the first embodiment, $H_2O$ is produced by oxygen ($O_2$) gas and hydrogen ($H_2$) gas of the flow rate of 10 liters/minute, respectively, and $H_2$ gas including 4% german (GeH$_4$) is applied to the furnace with the flow rate of 1 liter/minute. Then, an oxide layer is formed on the silicon wafer with an oxidation temperature of 800° C.

ii) The oxidation layer on the silicon wafer is taken off by ammonium fluoride.

iii) Then, a gate oxide layer is formed on the silicon wafer by an oxidization with 900° C. A gate electrode is further formed on the gate oxide layer to manufacture a metal oxide semiconductor (MOS) type capacitor.

iv) After that, a total charge to breakdown of the MOS type capacitor manufactured by the above process, is measured by a time dependent dielectric breakdown (TDDB) method.

Furthermore, a sample is manufactured after the pre-oxidation according to the conventional manufacturing method by using the same silicon wafer as this embodiment for a comparison. The manufacturing method of this comparison example is the same as this embodiment such as steps i) through iii) except that $H_2$ gas including german ($GeH_4$) is not used at forming the oxide layer such as step i).

When the total charge to breakdown of the MOS type capacitor of the sample obtained by the conventional method is compared with the sample of this embodiment, it can be understood that the sample of this embodiment has the total charge to breakdown twice as long as that of the sample of the conventional example because a micro-roughness on the silicon wafer of the sample in this embodiment is reduced.

Even though gas including german ($GeH_4$) is used as the gas including 4B group chemical element in the several embodiments described above, it is possible to obtain an effect of the present invention by using other compound gas including germanium (Ge) as the 4B chemical element. Furthermore, even when there is used gas including other 4B group elements such as tin and lead, it is also possible to obtain the same effect as the present invention. In FIGS. 3 and 4, there are shown relationship between micro-roughness and pre-oxide layer thickness in the case of tin and lead, respectively. In the figures, a square shows the relationship of tin, and a star shows that of lead.

Still furthermore, even though a content of 4B group element gas is 4 mol % in the above embodiments, it is possible to obtain the same effect as the present invention when the content changes within a range of 1–20 mol %.

What is claimed is:

1. A method of manufacturing a semiconductor device, including at least a pre-oxidation process comprising the steps of: first forming an oxide layer on a surface of a semiconductor substrate and then eliminating said oxide layer; wherein said oxide layer is formed in an oxidation atmosphere containing water vapor and a gas which includes a Group IVB element selected from the group consisting of germanium, tin, and lead.

2. The method according to claim 1: wherein said Group IVB element is present as the hydride.

3. The method according to claim 1: wherein said oxide layer is formed at a temperature of at least 750° C.

4. The method according to claim 1: wherein said oxide layer has a layer thickness of at least 30 nm.

5. The method according to claim 3, wherein said oxide layer is formed at a temperature between 750°–1000° C.

6. The method according to claim 4, wherein:

said oxide layer has a layer thickness of 30–800 nm.

7. The method according to claim 1, wherein:

said oxidation atmosphere further contains $H_2$ gas.

8. The method according to claim 1, wherein:

the oxide layer is eliminated by exposing it to ammonium fluoride.

9. The method according to claim 1, wherein:

said semiconductor substrate is p-doped.

10. The method according to claim 1, wherein:

said Group IVB element is present in said gas in an amount of 1–20 mol %.

11. The method according to claim 2, wherein:

said hydride of the Group IVB element is germanium hydride.

\* \* \* \* \*